US008163188B2

(12) United States Patent
Carter et al.

(10) Patent No.: US 8,163,188 B2
(45) Date of Patent: Apr. 24, 2012

(54) ARTICLE WITH PHEMA LIFT-OFF LAYER AND METHOD THEREFOR

(75) Inventors: Kenneth Raymond Carter, Hadley, MA (US); Sarav Bharat Jhaveri, Amherst, MA (US)

(73) Assignee: The University of Massachusetts, Boston, MA (US)

(*) Notice: Subject to any disclaimer, the term of this patent is extended or adjusted under 35 U.S.C. 154(b) by 1056 days.

(21) Appl. No.: 12/062,058

(22) Filed: Apr. 3, 2008

(65) Prior Publication Data
US 2009/0011141 A1  Jan. 8, 2009

Related U.S. Application Data

(60) Provisional application No. 60/909,866, filed on Apr. 3, 2007.

(51) Int. Cl.
*B05D 3/06* (2006.01)
*B05D 5/00* (2006.01)

(52) U.S. Cl. ............ 216/39; 427/534; 427/270; 427/552

(58) Field of Classification Search .................. None
See application file for complete search history.

(56) References Cited

U.S. PATENT DOCUMENTS
2009/0159567 A1* 6/2009 Jung et al. .................. 216/83
2010/0316849 A1* 12/2010 Millward et al. ............ 428/195.1

OTHER PUBLICATIONS

Von Werne, et al., Journal of the American Chemical Society 2003, 125, 3831-3838.
Guo, L.J., Journal of Physics D: Applied Physics 2004, 37, (11), R123-R141.
Resnick, D.J.; Sreenivasan, S.V.; Wilson, C.G., Materials Today (Oxford, United Kingdom) 2005, 8, (2), 34-42.
Guo, L.J., Proceedings of SPIE—The International Society for Optical Engineering 2005, 5734, (Quantum Dots, Nanoparticles, and Nanoclusters II), 53-64.
Tong, W.M., et al., Proceedings of SPIE—The International Society for Optical Engineering 2005, 5751, (Pt. 1, Emerging Lithographic Technologies IX), 46-55.
Austin, M.D., et al., Applied Physics Letters 2004, 84, (26), 5299-5301.
Nakamatsu, K.; Tone, K.; Matsui, S., Japanese Journal of Applied Physics, Part 1: Regular Papers, Brief Communications & Review Papers 2005, 44, (11), 8186-8188.
Barrett, G.D.; Constable, I.J.; Stewart, A.D., Journal of cataract and refractive surgery, FIELD Publication Date: 1986 12, (6), 623-31.
Hutcheon, G. A., et al., Biomaterials 2001, 22, (7), 667-676.
Robert, C.C.R.; Burt, P.A.; Peppas, N.A., Journal of Controlled Release 1987, 5, (2), 151-7.
Bantz, M.R., et al., Journal of Physical Chemistry B 2004, 108, (28), 9787-9794.
Sun, L.; Baker, G. L.; Bruening, M.L., Macromolecules 2005, 38, (6), 2307-2314.

(Continued)

*Primary Examiner* — Allan Olsen
(74) *Attorney, Agent, or Firm* — Cantor Colburn LLP

(57) ABSTRACT

A method of forming a patterned functional layer on a substrate using a poly(hydroxyethyl methacrylate) lift-off layer is described. The method can be used with substrates that would not tolerate the organic solvents required for processing of known poly(methyl methacrylate) lift-off layers. When used in combination with known nanoimprint lithography and step-and-flash imprint lithography techniques, the method can be used to generate patterned functional structures with dimensions as small as five nanometers.

25 Claims, 3 Drawing Sheets

OTHER PUBLICATIONS

Khoo, C.G.L.; Lando, J.B.; Ishida, H., Journal of Polymer Science, Part B: Polymer Physics 1990, 28, (2), 213-32.

Lesho, M.J.; Sheppard, N.F., Jr., Sensors and Actuators, B: Chemical 1996, B37, (1-2), 61-66.

Skrtic, D.; Antonucci, J. M.; Eanes, E.D.; Eidelman, N., Biomaterials 2003, 25, (7-8), 1141-1150.

Brantley, E. L.; Holmes, T. C.; Jennings, G. K., Journal of Physical Chemistry B 2004, 108, (41), 16077-16084.

Sun, L.; Dai, J.; Baker, G. L.; Bruening, M. L., Chemistry of Materials, 2006, vol. 18 No. 17, p. 4033.

Chen, Y.; Kang, E.T.; Neoh, K.G.; Grenier, A., Advanced Functional Materials 2005, 15, (1), 113-117.

Jethmalani, J. M.; Sunkara, H. B.; Ford, W. T.; Willoughby, S. L.; Ackerson, B.J., Langmuir 1997, 13, (10), 2633-2639.

Bourgeat-Lami, E., et al., Angewandte Makromolekulare Chemie 1996, 242, 105-122.

Ji, X., et al., Chemistry of Materials 2006, 18, (9), 2265-2274.

Courtois, J., et al., Journal of Separation Science 2006, 29, (1), 14-24.

Jon, S., et al., Langmuir 2003, 19, (24), 9989-9993.

Kurth, D.G.; Bein, T., Journal of Physical Chemistry 1992, 96, (16), 6707-12.

Zhang, K., et al., Macromolecular Materials and Engineering 2003, 288, (4), 380-385.

Rong, Y., et al., Colloids and Surfaces, A: Physicochemical and Engineering Aspects 2005, 253, (1-3), 193-197.

Yue, B., et al., Macromolecular Rapid Communications 2005, 26, (17), 1406-1411.

Liz-Marzan, L. M.; Giersig, M.; Mulvaney, P., Langmuir 1996, 12, (18), 4329-4335.

Wei, M. H., et al., Journal of Applied Polymer Science 2005, 98, (3), 1224-1228.

Brandrup, J., et al., Polymer Handbook, Fourth Edition, John Wiley, N. Y., pp. VII/675-714 (1999).

Moran, Isaac W., et al., High-resolution soft lithography of thin film resists enabling nanoscopic pattern transfer, Soft Matter, 2008, 4, 168-176 Abstract Only (1 page).

* cited by examiner

ARTICLE WITH PHEMA LIFT-OFF LAYER AND METHOD THEREFOR

CROSS REFERENCE TO RELATED APPLICATION

This application claims the benefit of U.S. Provisional Patent Application Ser. No. 60/909,866 filed Apr. 3, 2007, which is fully incorporated herein by reference.

STATEMENT REGARDING FEDERALLY SPONSORED RESEARCH & DEVELOPMENT

The U.S. Government has certain rights in this invention pursuant to National Science Foundation MRSEC on Polymers Grant No. DMR 0213695.

BACKGROUND OF THE INVENTION

Nanoimprint lithography (NIL) has gained acceptance in recent years as a viable low-cost alternative to photolithography for the patterning of nanoscale features. See, e.g., L. J. Guo, *Journal of Physics D: Applied Physics* (2004), volume 37, number 11, pages R123-R141; D. J. Resnick, S. V. Sreenivasan, and C. G. Willson, *Materials Today* (Oxford, United Kingdom) (2005), volume 8, number 2, pages 34-42; L. J. Guo, *Proceedings of SPIE-The International Society for Optical Engineering* (2005), 5734, (Quantum Dots, Nanoparticles, and Nanoclusters II), pages 53-64; W. M. Tong, S. D. Hector, G.-Y. Jung, W. Wu, J. Ellenson, K. Kramer, T. Hostetler, S. K. Richards, and R. S. Williams, *Proceedings of SPIE-The International Society for Optical Engineering* (2005), 5751, (Pt. 1, Emerging Lithographic Technologies IX), pages 46-55. Combining imprint lithography and lift-off is one of the major process routes to obtain multiple arrays of nanoelectrodes, with reported fabrication of gold contacts with as small as five nanometer separation. M. D. Austin, H. Ge, W. Wu, M. Li, Z. Yu, D. Wasserman, S. A. Lyon, and S. Y. Chou, *Applied Physics Letters* (2004), volume 84, number 26, pages 5299-5301. Lift-off process in tandem with NIL has been previously reported using a few different polymers. For example, poly(methyl methacrylate) (PMMA) has been selectively stripped with acetone as a solvent. Id. As another example, a lift-off process using poly(vinyl alcohol) and water as a solvent has been described. K.-I. Nakamatsu, K. Tone, and S. Matsui, *Japanese Journal of Applied Physics, Part I: Regular Papers, Brief Communications, and Review Papers* (2005), volume 44, no. 11, pages 8186-8188. Notably, for both of these polymers, the imprinting has been employed using direct thermal molding of the polymer layer in presence of pressurized mold and without the use of any photosensitive polymer resin or ultraviolet (UV) radiation curing process. Poly(methyl methacrylate) is soluble in various organic solvents commonly employed in the application of polymeric and organic layers. Solvents such as tetrahydrofuran (THF), toluene, and propylene glycol methyl ether acetate (PGMEA) are commonly used in these application processes. However, the use of such strong organic solvents severely restricts the use of many polymeric materials as substrates. There is therefore a need for materials and processes that can enable the formation of patterned functional layers via lift-off processes while avoiding the use of strong organic solvents.

BRIEF DESCRIPTION OF THE INVENTION

The above-described and other drawbacks are alleviated by a method of forming an article comprising a patterned functional layer, the method comprising: coating a surface of a substrate with a layer comprising a poly(hydroxyethyl methacrylate); coating a layer comprising functionalizing agent on a surface of the poly(hydroxyethyl methacrylate) layer; wherein the functionalizing agent comprises a polymerizable group and a hydrolyzable group; coating a layer comprising a polymerizable composition on the layer comprising functionalizing agent; contacting a patterned stamp with the layer comprising the polymerizable composition to form a patterned layer comprising the polymerizable composition; polymerizing the patterned layer comprising the polymerizable composition while the patterned stamp is in contact with it to form a patterned layer comprising a polymerized composition; separating the patterned stamp from the patterned layer comprising the polymerized composition to form an article comprising a substrate, a poly(hydroxyethyl methacrylate) layer, a layer comprising functionalizing agent, and a patterned layer comprising a polymerized composition; etching the article from a surface comprising the patterned layer comprising the polymerized composition to form an etched article comprising trenches bounded by a floor comprising exposed substrate, and walls comprising poly(hydroxyethyl methacrylate); coating a functional layer on a surface of the etched article comprising exposed substrate to form an article comprising a functional layer; and treating the article comprising a functional layer with a solvent to lift off the poly(hydroxyethyl methacrylate) layer, thereby forming an article comprising a patterned functional layer in contact with the substrate.

Another embodiment is a method of forming an article comprising a patterned functional layer, the method comprising: coating a surface of a substrate with a layer comprising a poly(hydroxyethyl methacrylate) to form a first structure; coating a layer comprising a functionalizing agent on a surface of the poly(hydroxyethyl methacrylate) layer to form a second structure; wherein the functionalizing agent comprises a polymerizable group and a hydrolyzable group; coating a layer comprising a polymerizable composition on the layer comprising a functionalizing agent to form a third structure comprising a substrate, a poly(hydroxyethyl methacrylate) layer, a functionalizing agent layer, and a polymerizable composition layer; contacting a patterned stamp with the polymerizable composition layer to form a fourth structure comprising a substrate, a poly(hydroxyethyl methacrylate) layer, a functionalizing agent layer, a patterned polymerizable composition layer, and a patterned stamp; polymerizing the patterned polymerizable composition while the patterned stamp is in contact with it to form a fifth structure comprising a substrate, a poly(hydroxyethyl methacrylate) layer, a functionalizing agent layer, a patterned layer comprising a polymerized composition, and a patterned stamp; separating the patterned stamp from the patterned layer comprising the polymerized composition to form a sixth structure comprising a substrate, a poly(hydroxyethyl methacrylate) layer, a functionalizing agent layer, and a patterned layer comprising a polymerized composition; etching the sixth structure from a surface comprising the patterned layer to form a seventh structure comprising a substrate and a patterned poly(hydroxyethyl methacrylate) layer; wherein the seventh structure comprises trenches bounded by a floor comprising exposed substrate, and walls comprising poly(hydroxyethyl methacrylate); coating a functional layer on a surface of the seventh structure to form an eighth structure comprising a substrate, a patterned poly(hydroxyethyl methacrylate) layer, and a functional layer; wherein the eighth structure comprises trenches bounded by a floor comprising a functional layer in contact with the underlying substrate, and walls comprising a functional layer and a poly(hydroxyethyl methacrylate) layer; and treating the eighth structure with a solvent to lift off the poly(hydroxyethyl methacrylate) layer to form a ninth structure comprising a patterned functional layer and a substrate; wherein for each structure the layers are in the recited order, with each layer contacting the previously recited layer.

Other embodiments include the second structure, the third structure, the fourth structure, the fifth structure, the sixth structure, the seventh structure, and the eighth structure prepared by the above method.

Another embodiment is a method for forming an article comprising a patterned metallic layer, the method comprising: coating a poly(hydroxyethyl methacrylate) layer on a surface of a silicon substrate; coating a 3-methacryloxypropyltrimethoxysilane layer on a surface of the poly(hydroxyethyl methacrylate) layer; coating a photopolymerizable acrylate layer on a surface of the 3-methacryloxypropyltrimethoxysilane layer; contacting a surface of the photopolymerizable acrylate layer with a UV-translucent patterned stamp; wherein the UV-translucent patterned stamp is applied to the surface of the photopolymerizable acrylate layer with a pressure of about 0.001 to about 15 megapascals; photopolymerizing the photopolymerizable acrylate layer by exposing it to ultraviolet light via the UV-translucent patterned stamp; separating the UV-translucent patterned stamp from the photopolymerized acrylate layer; oxygen plasma etching the photopolymerized acrylate layer, the 3-methacryloxypropyltrimethoxysilane layer, and the poly(hydroxyethyl methacrylate) layer to form a seventh structure comprising a silicon substrate and a patterned poly(hydroxyethyl methacrylate) layer; wherein the seventh structure comprises trenches bounded by a floor comprising exposed silicon substrate, and walls comprising poly(hydroxyethyl methacrylate); coating gold on a surface of the seventh structure to form an eighth structure comprising a gold layer, a patterned poly(hydroxyethyl methacrylate) layer, and a silicon substrate; and agitating the eighth structure in the presence of methanol to lift off the patterned poly(hydroxyethyl methacrylate) layer and yield a ninth structure comprising a patterned gold layer in contact with the silicon substrate.

Another embodiment is article comprising a substrate, a poly(hydroxyethyl methacrylate) layer in contact with the substrate, and a functionalizing agent layer disposed on a surface of the poly(hydroxyethyl methacrylate) layer opposite the substrate.

Another embodiment is an article comprising a substrate, a poly(hydroxyethyl methacrylate) layer in contact with the substrate, a functionalizing agent layer disposed on a surface of the poly(hydroxyethyl methacrylate) layer opposite the substrate, and a polymerizable composition layer disposed on a surface of the functionalizing agent layer opposite the poly(hydroxyethyl methacrylate) layer.

Another embodiment is an article comprising a substrate, a poly(hydroxyethyl methacrylate) layer in contact with the substrate, a functionalizing agent layer disposed on a surface of the poly(hydroxyethyl methacrylate) layer opposite the substrate, and a polymerized composition layer disposed on a surface of the functionalizing agent layer opposite the poly(hydroxyethyl methacrylate) layer.

Another embodiment is an article comprising a substrate and a patterned poly(hydroxyethyl methacrylate) layer in contact with the substrate; wherein the article comprises trenches bounded by a floor comprising exposed substrate and walls comprising poly(hydroxyethyl methacrylate).

Another embodiment is an article comprising a substrate, a patterned poly(hydroxyethyl methacrylate) layer, and a functional layer; wherein the article comprises trenches bounded by a floor comprising a functional layer in contact with the substrate, and walls comprising a functional layer in contact with the patterned poly(hydroxyethyl methacrylate) layer which is itself in contact with the substrate.

These and other embodiments are described in detail below.

DETAILED DESCRIPTION OF THE INVENTION

Figure 1:
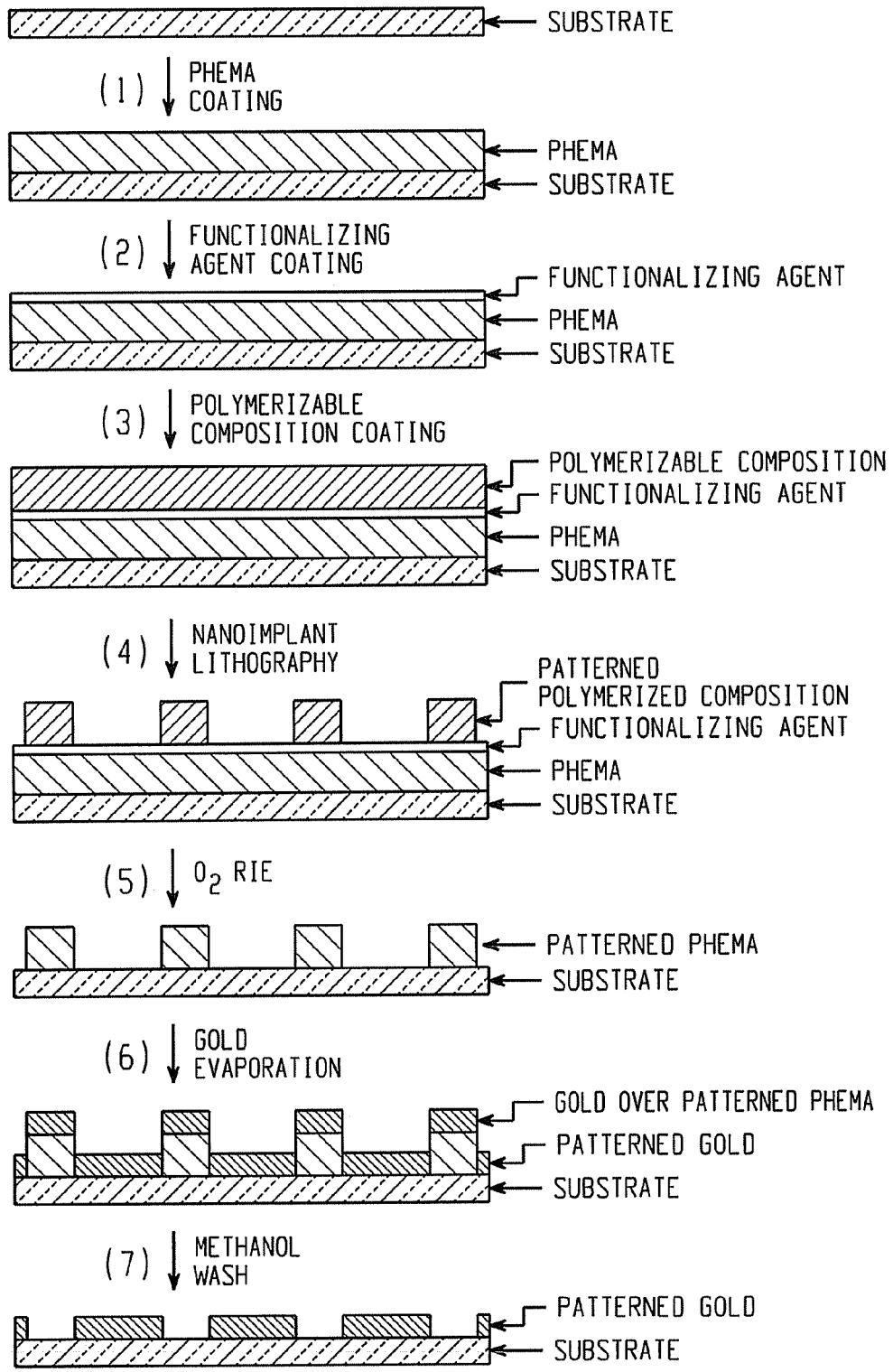
FIG. 1 is a diagrammatic representation of a particular embodiment of the method.

The current invention involves the use of contact molding lithography to pattern the surface of a polymerizable layer overlying a poly(hydroxyethyl methacrylate (PHEMA) layer. After the patterning step, the PHEMA layer can be used to create secondary patterns by lift-off techniques. This lift-off process can be used along with the contact molding process to fabricate patterns on top of the PHEMA layer and these patterns can then be easily transferred to the bottom layers via an etching technique such as reactive ion etching (RIE).

2-Hydroxyethyl methacrylate (HEMA) is a commercially important functional monomer. The hydrophilic character contributed by the hydroxyl group renders polymers of HEMA able to absorb more than their own weight in water and to behave as hydrogels. The biocompatible and non-toxic nature of PHEMA has made it an ideal choice polymer for biomedical applications such as soft contact lenses materials (see, e.g., G. D. Barrett, I. J. Constable, and A. D. Stewart, *Journal of Cataract and Refractive Surgery* (1986), volume 12, no. 6, pages 623-631), bone implants (see, e.g., G. A. Hutcheon, C. Messiou, R. M. Wyre, M. C. Davies, and S. Downes, *Biomaterials* (2001), volume 22, number 7, pages 667-676), and in controlled drug release (see, e.g., C. C. R. Robert, P. A. Bui, and N. A. Peppas, *Journal of Controlled Release* (1987), volume 5, number 2, pages 151-157). PHEMA swells considerably in water, though it is not completely soluble, and it is considerably more soluble in methanol and ethanol.

One embodiment is a method of forming an article comprising a patterned functional layer, the method comprising: coating a surface of a substrate with a layer comprising a poly(hydroxyethyl methacrylate); coating a layer comprising functionalizing agent on a surface of the poly(hydroxyethyl methacrylate) layer; wherein the functionalizing agent comprises a polymerizable group and a hydrolyzable group; coating a layer comprising a polymerizable composition on the layer comprising functionalizing agent; contacting a patterned stamp with the layer comprising the polymerizable composition to form a patterned layer comprising the polymerizable composition; polymerizing the patterned layer comprising the polymerizable composition while the patterned stamp is in contact with it to form a patterned layer comprising a polymerized composition; separating the patterned stamp from the patterned layer comprising the polymerized composition to form an article comprising a substrate, a poly(hydroxyethyl methacrylate) layer, a layer comprising functionalizing agent, and a patterned layer comprising a polymerized composition; etching the article from a surface comprising the patterned layer comprising the polymerized composition to form an etched article comprising trenches bounded by a floor comprising exposed substrate, and walls comprising poly(hydroxyethyl methacrylate); coating a functional layer on a surface of the etched article comprising exposed substrate to form an article comprising a functional layer; and treating the article comprising a functional layer with a solvent to lift off the poly(hydroxyethyl methacrylate) layer, thereby forming an article comprising a patterned functional layer in contact with the substrate.

The substrate can comprise any material onto which the poly(hydroxyethyl methacrylate) layer can be coated, to which the coated poly(hydroxyethyl methacrylate) layer will adhere sufficiently in the intermediate process steps, and which is chemically resistant to the solvent treatment step by which the poly(hydroxyethyl methacrylate) layer is lifted off. Suitable substrate materials include, for example, silicon (that is, elemental silicon), silicon oxides, glass, metals (including metal alloys), metal oxides (including, for example, oxides of gallium and germanium), metal nitrides (including, for example, nitrides of gallium and germanium), polymers (including elastomeric polymers, thermoplastic polymers, thermoset polymers, and photocrosslinked polymers such), semiconductors (including gallium arsenide), conducting oxides (including, for example, indium tin oxide (ITO)), mica, sapphire, organic crystals, and organic thin films. In some embodiments, the substrate is silicon. It will be understood that silicon substrates include not only pure silicon but silicon with small amounts of dopants.

The substrate can take various physical forms, including, for example, a wafer, a tape, or a film. In some embodiments, the substrate surface onto which the poly(hydroxyethyl methacrylate) layer is planar. In other embodiments, the substrate surface onto which the poly(hydroxyethyl methacrylate) layer is curved. There is no particular limit on the thickness of the substrate, which can vary widely according to the intended use of the final article. Substrate thicknesses can range from 0.1 micrometer (1 Angstrom) for thin film substrates to centimeters or even meters for very thick slab substrates.

The method comprises coating a surface of the substrate with a layer comprising a poly(hydroxyethyl methacrylate). As used herein, the term "poly(hydroxymethyl methacrylate)" refers to a polymer comprising at least 20 weight percent of repeating units derived from hydroxyethyl methacrylate. In other words, the poly(hydroxyethyl methacrylate) comprises at least 20 weight percent of repeating units having the structure

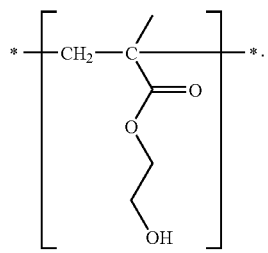

In some embodiments, the poly(hydroxyethyl methacrylate) comprises at least 50 weight percent of such repeating units, specifically at least 70 weight percent of such repeating units, more specifically at least 90 weight percent of such repeating units, even more specifically about 95 weight percent of such repeating units.

In some embodiments, the poly(hydroxyethyl methacrylate is a homopolymer of hydroxyethyl methacrylate. In other embodiments, the poly(hydroxyethyl methacrylate) is a copolymer prepared by a method comprising copolymerizing monomers comprising hydroxyethyl methacrylate and at least one different monomer. Monomers suitable for copolymerization with hydroxyethyl methacrylate include, for example, hydroxyethyl acrylate, various alkyl acrylates and alkyl methacrylates (for example, where the alkyl group is methyl, ethyl, propyl, and butyl), aryl methacrylates (for example, phenyl methacrylate), styrene, and mixtures thereof.

In order to provide solubility properties substantially different from those of known poly(methyl methacrylate) and poly(vinyl alcohol) lift-off layers, the poly(hydroxyethyl methacrylate) can have a Hildebrand solubility parameter of about 20 to about 26 megapascal$^{1/2}$, specifically about 23 to about 25 megapascal$^{1/2}$. Hildebrand solubility parameters may be calculated using methods known in the art. For example, the MATPROP program available from Technomics estimates a Hildebrand solubility parameter of about 24 for a homopolymer of 2-hydroxyethyl methacrylate. Hildebrand solubility parameters values for many polymers are also tabulated in, for example, J. Brandrup, E. H. Immergut, and E. A. Grulke, Eds. "Polymer Handbook, 4th Ed.", John Wiley, N.Y., pp VII/675-714 (1999).

The layer comprising poly(hydroxyethyl methacrylate) may be coated on the substrate using techniques known in the art for coating polymer layers, including, for example, solvent casting, spin coating, drop casting, doctor blading, dip coating, ink jetting, roll coating, extrusion coating, spraying, polymerization casting, melt processing, electrostatic coating, powder coating, Meier rod coating methods, Langmuir-Blodgett techniques, and the like. When the poly(hydroxyethyl methacrylate) layer is coated as part of a coating composition that further comprises solvent, the method may, optionally, further comprise a drying step to remove solvent from the coated poly(hydroxyethyl methacrylate) layer.

In some embodiments, the poly(hydroxyethyl methacrylate) layer comprises at least 20 weight percent poly(hydroxyethyl methacrylate), specifically comprises at least 50 weight percent poly(hydroxyethyl methacrylate), more specifically comprises at least 70 weight percent poly(hydroxyethyl methacrylate), even specifically comprises at least 90 weight percent poly(hydroxyethyl methacrylate), still specifically comprises at least 95 weight percent poly(hydroxyethyl methacrylate). In some embodiments, the poly(hydroxyethyl methacrylate) layer consists of poly(hydroxyethyl methacrylate). In some embodiments, the poly(hydroxyethyl methacrylate) layer consists of a homopolymer of hydroxyethyl methacrylate.

In some embodiments, the poly(hydroxyethyl methacrylate) layer has a thickness of about 10 nanometers to about 50 micrometers, specifically about 50 nanometers to about 10 micrometers. As used herein, the term "thickness" refers to the dimension of the layer perpendicular to the instantaneous plane of the underlying layer.

After the substrate is coated with a layer comprising poly(hydroxyethyl methacrylate), a layer comprising functionalizing agent is coated on the layer comprising poly(hydroxyethyl methacrylate). The functionalizing agent is a compound that comprises at least one polymerizable group and at least one hydrolyzable group capable of reacting with a hydroxy group of the poly(hydroxyethyl methacrylate). The polymerizable group allows covalent bonding between the functionalizing group and the overlying polymerized layer. Suitable polymerizable groups include, for example, vinyl (also known as ethenyl; including the vinyl group of a styryl group), allyl, ethynyl, propargyl, acryloyl, and methacryloyl. Suitable hydrolyzable groups include, for example, alkoxysilyl groups (—Si—OR), acid halide groups (—C(=O)X, wherein X is chloro, bromo, or iodo), chlorosilyl groups (Si—Cl), silyl hydride groups (Si—H), silazane groups (Si—NH—Si), urethane groups (—NH—C(O)—OR), isocyanate groups (—N=C=O), and the like.

Specific functionalizing agents suitable for use in the method include, for example, 3-acryloxypropyldimethoxysilane, 3-acryloxypropyldimethylmethoxysilane, 3-acryloxypropylmethyldimethoxysilane, 3-methacryloxymethyltriethoxysilane, 3-methacryloxymethyltrimethoxysilane, 3-methacryloxypropyldimethylethoxysilane, 3-methacryloxypropyldimethylmethoxysilane, 3-methacryloxypropylmethyldiethoxysilane, 3-methacryloxypropylmethyldimethoxysilane, 3-methacryloxypropyltrimethoxysilane, 3-methacryloxypropyltriethoxysilane, 3-methacryloxypropyldimethylchlorosilane, 3-methacryloxypropylmethyldichlorosilane, 3-methacryloxypropyltrichlorosilane, $C_6$-$C_{18}$ alkenoic acid halides (including $C_6$-$C_{18}$ 1-alkenoic acid chlorides and $C_6$-$C_{18}$ 1-alkenoic acid bromides), and mixtures thereof. In some embodiments, the functionalizing agent is 3-methacryloxypropyltrimethoxysilane. The functionalizing agent is typically in the form of a liquid, and it may be coated using a technique such as spin coating, dipping, spraying, drop casting, solvent soak, vapor phase coating, or the like.

The method may, optionally, further include heating the article to accelerate the reaction between the functionalizing agent and the poly(hydroxyethyl methacrylate). The method may, optionally, further comprise removing unreacted functionalizing agent. For example, the article may be washed with a solvent in which the functionalizing agent is highly soluble but the PHEMA layer is sparingly soluble or insoluble.

It will be understood that the hydrolyzable group of the functionalizing agent reacts with a hydroxyl group of the poly(hydroxyethyl methacrylate) to form a covalent bond. So, while, for convenience, reference is made herein to the "layer comprising functionalizing agent", it will be understood that such references encompass layers comprising the residue of the functionalizing agent that remains after the reaction between the functionalizing agent and the poly(hydroxyethyl methacrylate). Such references also encompass layers comprising the residue of the functionalizing agent that remains after the polymerizable group of the functionalizing agent is copolymerized with the overlying polymerizable composition.

After the layer comprising functionalizing agent is coated on the layer comprising poly(hydroxyethyl methacrylate), a layer comprising a polymerizable composition is coated on the layer comprising functionalizing agent. The polymerizable composition may be any composition capable of thermal or photochemical polymerization, including photopolymers used as so-called "imprint resists". In some embodiments, the polymerizable composition comprises an acrylate monomer. As used herein, the term "acrylate monomer" refers to a monomer comprising at least one acrylate or methacrylate group. Suitable acrylate monomers include, for example, methyl acrylate, methyl methacrylate, butyl acrylate, butyl methacrylate, and the like, and mixtures thereof. In some embodiments, the polymerizable composition comprises a multifunctional acrylate monomer and a photoinitiator. As used herein, the term "multifunctional acrylate monomer" refers to a monomer comprising at least two acrylate and/or methacrylate polymerizable groups. Suitable multifunctional acrylate monomers include, for example, bisphenol A diacrylate, bisphenol A dimethacrylate, ethoxylated bisphenol A diacrylate, ethoxylated bisphenol A dimethacrylate, trimethylolpropane trimethacrylate, 2-ethyl-2-(hydroxymethyl)-1,3-propanediol triacrylate, 2-ethyl-2-(hydroxymethyl)-1,3-propanediol trimethacrylate, hexanediol diacrylate, cyclohexanediol diacrylate, butanediol diacrylate, other $\alpha,\omega$-diol diacrylates and dimethacrylates, polyethylene glycol diacrylates and dimethacrylates, siloxane-containing acrylates and methacrylates, cyclic phosphazene acrylates and methacrylates, fluorinated alkyl ethers with acrylate or methacrylate endgroups, and the like, and mixtures thereof. Other polymerizable compounds suitable for use in the polymerizable composition include divinylbenzene, vinyl ethers, and $\alpha,\omega$-ethynyl-disubstituted monomers and macromonomers. Photoinitiators for polymerizable compositions are known in the art and include, for example, acetophenone photoinitiators such as 1-hydroxycyclohexyl phenyl ketone and 2,2-diethoxyacetophenone and 2,2-dimethoxy-2-phenylacetophenone, benzil/benzoin photoinitiators such as 2,2-dimethoxy-2-phenylacetophenone and 4-(dimethylamino) benzoin, benzophenone photoinitiators such as 2,5-dimethylbenzophenone and Michler's ketone, thioxanthones such as 10-methylphenothiazine, and the like, and mixtures thereof. Other suitable photoinitiators, as well as thermal initiators, are described at http://www.sigmaaldrich.com/Area_of_Interest/Chemistry/Materials_Science/Polymerization_Tools/Initiators.html.

In some embodiments, the layer comprising the polymerizable composition has a thickness of about 5 nanometers to about 2 millimeters, specifically about 50 nanometers to about 1 micrometer, measured prior to contact with the patterned stamp.

The method further comprises contacting a patterned stamp with the layer comprising the polymerizable composition to form a patterned layer comprising the polymerizable composition. Suitable patterned stamps are known in the art and include those described for use in nanoimprint lithography and step-and-flash imprint lithography. The patterned stamp is typically contacted with the polymerizable composition at a pressure of about 0.001 to about 50 megapascals, specifically about 0.01 to about 20 megapascals, more specifically about 0.5 to about 15 megapascals.

The patterned features of the patterned stamp may have widely ranging dimensions. For example, the patterned features may have a depth (that is, the dimension perpendicular to the plane of the layer) of about 5 nanometers to about 1 millimeter, specifically about 10 nanometers to about 20 micrometers, more specifically about 20 nanometers to about 100 nanometers. In some embodiments, the patterned features have a width (that is, the narrowest dimension parallel to the plane of the layer) of about 5 nanometers to about 1 millimeter, specifically about 10 nanometers to about 100 micrometers, more specifically about 20 nanometers to about 500 nanometers.

The method further comprises polymerizing the patterned layer comprising the polymerizable composition while the patterned stamp is in contact with it to form a patterned layer comprising a polymerized composition. Thermal or photochemical polymerization may be employed. Polymerization forms a polymerized composition that is hardened relative to the polymerizable composition and is capable of maintaining the patterned features impressed by the patterned stamp after that stamp is removed.

The method further comprises separating the patterned stamp from the patterned layer comprising the polymerized composition. After the patterned stamp is removed, the article comprises in the following order a substrate, a layer comprising poly(hydroxyethyl methacrylate), a layer comprising the residue of functionalizing agent, and a patterned layer comprising the polymerized composition.

The method further comprises etching the article from a surface comprising the patterned layer to form an etched article comprising trench floors comprising exposed substrate, and trench walls comprising poly(hydroxyethyl methacrylate). The trenches correspond to the raised surfaces of the patterned stamp. Suitable etching techniques include, for example, dry chemical etching, plasma etching, wet chemical etching, micromachining, electron beam writing, reactive ion etching, laser micromachining, ablation (including sand blasting), mechanical machining, mechanical abrasion or scratching, drilling, ion beam milling, UV degradation, and evaporation. In some embodiments, the article is anisotropically etched with an oxygen plasma.

After etching, a functional layer is formed on the article. The functional layer comprises a material that acts as, for example, an electrically conducting material, a semiconducting material, an electrically insulating material, a thermally conductive material, a thermally insulating material, or a magnetic material. Materials suitable for forming the functional layer include metals such as, for example, aluminum, gallium, germanium, indium, tin, antimony, thallium, lead, bismuth, polonium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, and alloys of at least two of the foregoing metals. Materials suitable for forming the functional layer further comprise non-metals, including, for example, silicon, phosphorus, arsenic, sulfur, selenium, tellurium, and compounds consisting of two or more of such elements. Materials suitable for forming the functional layer further include oxides, nitrides, and carbides of metals and non-metals. Materials suitable for forming the functional layer further include compounds of metal and non-metals. Among the suitable materials, those classified as electrically conductive materials include the above-described metals and indium tin oxide and titanium oxide. Those classified as semiconducting materials include silicon, gallium arsenide, indium phosphide, mercury cadmium telluride, cadmium sulfide, and cadmium telluride. Those classified as electrically insulating materials include, for example, silicon oxide, silicon nitride, and titanium nitride. Those classified as thermally conductive materials include, for example, the above-described metals and boron nitride. Those classified as thermally insulating materials include, for example, alumina and silicon dioxide. Those classified as magnetic materials include, for example, cobalt, cobalt/platinum, nickel, and iron. Methods of forming functional layers using the above materials are known in the art.

In some embodiments, the functional layer is a metallic layer comprising one or more of the above-described metals. In some embodiments, the metallic layer comprises at least 90 weight percent gold, specifically at least 95 weight percent gold, more specifically at least 98 weight percent gold. The metallic layer may be formed using metal deposition techniques known in the art, including, for example, evaporating, sputtering, electroplating, and electroless plating, sintering of metal particles, epitaxial growth, chemical vapor deposition (CVD), Metalorganic Chemical Vapor Deposition (MOCVD), and supercritical fluid deposition. In some embodiments, the metallic layer is formed by evaporating metal onto the etched article.

In some embodiments, the metallic layer has a thickness of about 1 nanometer to about 50 micrometers, specifically about 5 nanometers to about 10 micrometers, more specifically about 10 nanometers to about 1 micrometer.

After the functional layer is coated, the article is treated with a solvent to lift off the poly(hydroxyethyl methacrylate) layer), thereby forming an article comprising a patterned functional layer in contact with the substrate. In some embodiments, the solvent has a Hildebrand solubility parameter of about 23 to about 35 megapasca$^{1/2}$, specifically about 25 to about 33 megapascal$^{1/2}$, more specifically about 27 to about 31 megapascal$^{1/2}$. Suitable solvents include, for example, methanol, ethanol, n-propanol, isopropanol, ethylene glycol, propylene glycol, 1-methoxy-2-propanol, 1-phenoxy-2-propanol, dimethylformamide (DMF), dimethylacetamide (DMA), N-methyl-2-pyrrolidone (NMP), N-cyclohexyl-2-pyrrolidinone (CHP), hexamethylphosphoramide (HMPA), 1,3-dimethyl-3,4,5,6-tetrahydro-2(1H)-pyrimidinone (N,N'-dimethylpropyleneurea; DMPU; CAS Reg. No. 7226-23-5), dimethyl sulfoxide, m-cresol, formic acid, and mixtures thereof. Typically, the treatment with solvent comprises immersing the article in solvent and agitating the article within the solvent as, for example, by sonication.

In some embodiments, the solvent is methanol, ethanol, or a mixture thereof. In some embodiments, the solvent is methanol.

In some embodiments, treating the metal-coated article with solvent substantially removes the poly(hydroxyethyl methacrylate) layer from the article, leaving an article consisting of a patterned functional layer in contact with the substrate.

One embodiment is a method of forming an article comprising a patterned functional layer, the method comprising: coating a surface of a substrate with a layer comprising a poly(hydroxyethyl methacrylate) to form a first structure; coating a layer comprising a functionalizing agent on a surface of the poly(hydroxyethyl methacrylate) layer to form a second structure; wherein the functionalizing agent comprises a polymerizable group and a hydrolyzable group; coating a layer comprising a polymerizable composition on the layer comprising a functionalizing agent to form a third structure comprising a substrate, a poly(hydroxyethyl methacrylate) layer, a functionalizing agent layer, and a polymerizable composition layer; contacting a patterned stamp with the polymerizable composition layer to form a fourth structure comprising a substrate, a poly(hydroxyethyl methacrylate) layer, a functionalizing agent layer, a patterned polymerizable composition layer, and a patterned stamp; polymerizing the patterned polymerizable composition while the patterned stamp is in contact with it to form a fifth structure comprising a substrate, a poly(hydroxyethyl methacrylate) layer, a functionalizing agent layer, a patterned layer comprising a polymerized composition, and a patterned stamp; separating the patterned stamp from the patterned layer comprising the polymerized composition to form a sixth structure comprising a substrate, a poly(hydroxyethyl methacrylate) layer, a functionalizing agent layer, and a patterned layer comprising a polymerized composition; etching the sixth structure from a surface comprising the patterned layer to form a seventh structure comprising a substrate and a patterned poly(hydroxyethyl methacrylate) layer; wherein the seventh structure comprises trenches bounded by a floor comprising exposed substrate, and walls comprising poly(hydroxyethyl methacrylate); coating a functional layer on a surface of the seventh structure to form an eighth structure comprising a substrate, a patterned poly(hydroxyethyl methacrylate) layer, and a functional layer; wherein the eighth structure comprises trenches bounded by a floor comprising a functional layer in contact with the underlying substrate, and walls comprising a functional layer and a poly(hydroxyethyl methacrylate) layer; and treating the eighth structure with a solvent to lift off the poly(hydroxyethyl methacrylate) layer to form a ninth structure comprising a patterned functional layer and a substrate; wherein for each structure the layers are in the recited order, with each layer contacting the previously recited layer. Other embodiments include a second structure prepared by the above method, a third structure prepared by the above method, a fourth structure prepared by the above method, a fifth structure prepared by the above method, a sixth structure prepared by the above method, a seventh structure prepared by the above method, and an eighth structure prepared by the above method.

Another embodiment is a method for forming an article comprising a patterned metallic layer, the method comprising: coating a poly(hydroxyethyl methacrylate) layer on a surface of a silicon substrate; coating a 3-methacryloxypropyltrimethoxysilane layer on a surface of the poly(hydroxyethyl methacrylate) layer; coating a photopolymerizable acrylate layer on a surface of the 3-methacryloxypropyltrimethoxysilane layer; contacting a surface of the photopolymerizable acrylate layer with a UV-translucent patterned stamp; wherein the UV-translucent patterned stamp is applied to the surface of the photopolymerizable acrylate layer with a pressure of about 0.001 to about 15 megapascals; photopolymerizing the photopolymerizable acrylate layer by exposing it to ultraviolet light via the UV-translucent patterned stamp; separating the UV-translucent patterned stamp from the photopolymerized acrylate layer; oxygen plasma etching the photopolymerized acrylate layer, the 3-methacryloxypropyltrimethoxysilane layer, and the poly(hydroxyethyl methacrylate) layer to form a seventh structure comprising a silicon substrate and a patterned poly(hydroxyethyl methacrylate) layer; wherein the seventh structure comprises trenches bounded by a floor comprising exposed silicon substrate, and walls comprising poly(hydroxyethyl methacrylate); coating gold on a surface of the seventh structure to form an eighth structure comprising a gold layer, a patterned poly(hydroxyethyl methacrylate) layer, and a silicon substrate; and agitating the eighth structure in the presence of methanol to lift off the patterned poly(hydroxyethyl methacrylate) layer and yield a ninth structure comprising a patterned gold layer in contact with the silicon substrate.

A particular embodiment of a method of forming an article is schematically represented in FIG. 1. In the step numbered "(1)", a substrate is coated with a poly(hydroxyethyl methacrylate) (PHEMA) layer. In the step numbered "(2)", a functionalizing agent is coated on the PHEMA layer, and the hydrolyzable group of the functionalizing agent reacts with a hydroxy group of the poly(hydroxyethyl methacrylate). In the step numbered "(3)", a polymerizable composition is coated on the functionalizing agent layer. The step numbered "(4)" actually encompasses three substeps. In the first substep, a patterned stamp is applied to the surface of the polymerizable composition layer. In the second substep, the patterned polymerizable composition is polymerized. And in the third substep, the patterned stamp is removed from the surface of the patterned polymerized composition layer. In the step labeled "(5)", oxygen reactive ion etching ("O$_2$ RIE") is used etch the surface of the article, leaving a patterned PHEMA layer on the substrate. (It will be understood that the layer described as a "patterned PHEMA layer" may further comprise a portion of the polymerized composition layer and some or all of the functionalizing agent layer.) In the step labeled "(6)", a gold layer is evaporated onto the article, creating regions with gold-on-substrate and other regions with gold-on-PHEMA-on-substrate. In the step labeled "(7)", methanol is used to swell and remove the PHEMA lift-off layer, leaving an article consisting of patterned gold on substrate.

Another embodiment is an article comprising a substrate, a poly(hydroxyethyl methacrylate) layer in contact with the substrate, and a functionalizing agent layer disposed on a surface of the poly(hydroxyethyl methacrylate) layer opposite the substrate.

Another embodiment is an article comprising a substrate, a poly(hydroxyethyl methacrylate) layer in contact with the substrate, a functionalizing agent layer disposed on a surface of the poly(hydroxyethyl methacrylate) layer opposite the substrate, and a polymerizable composition layer disposed on a surface of the functionalizing agent layer opposite the poly(hydroxyethyl methacrylate) layer.

Another embodiment is an article comprising a substrate, a poly(hydroxyethyl methacrylate) layer in contact with the substrate, a functionalizing agent layer disposed on a surface of the poly(hydroxyethyl methacrylate) layer opposite the substrate, and a polymerized composition layer disposed on a surface of the functionalizing agent layer opposite the poly(hydroxyethyl methacrylate) layer.

Another embodiment is an article comprising a substrate and a patterned poly(hydroxyethyl methacrylate) layer in contact with the substrate; wherein the article comprises trench floors comprising exposed substrate and trench walls comprising poly(hydroxyethyl methacrylate).

Another embodiment is an article comprising a substrate, a patterned poly(hydroxyethyl methacrylate) layer, and a functional layer; wherein the article comprises trenches bounded by a floor comprising a functional layer in contact with the substrate, and walls comprising a functional layer in contact with the patterned poly(hydroxyethyl methacrylate) layer which is itself in contact with the substrate.

The invention is further illustrated by the following non-limiting examples.

EXAMPLE 1

PHEMA was synthesized by the following procedure. Ethanol (7.5 milliliters (mL)) was taken in a test-tube and nitrogen was bubbled through it for 5 minutes. Azobisisobutyronitrile (AIBN; 0.07 grams (g), 0.43 millimoles (mmol)), HEMA (5.37 g, 5 mL, and 41.31 mmol), and dodecane thiol (0.43 g, 0.5 mL) were dissolved in ethanol and the solution was heated under nitrogen at 60° C. for 4 hours. The solution was cooled down and the polymer product was precipitated dropwise in hexanes. The polymer product was filtered, washed with hexanes and dried to obtain PHEMA (4.5 g, 84%) as a white solid. Analysis by gel permeation chromatography (GPC) in dimethylformamide indicated a number average molecular weight, $M_n$, of 32,353 atomic mass units, and a polydispersity index, PDI ($M_w/M_n$), of 1.37.

A clean silicon wafer was washed with ethanol and dried, and a PHEMA solution (8 weight percent in methanol) was spin coated (3000 rotations per minute (rpm) for 30 seconds) on the wafer. The wafer was heated on a hotplate at 100° C. for 2 minutes to remove residual solvent, leaving a thin PHEMA film. A puddle of 3-methacryloxypropyltrimethoxysilane was applied to the entire PHEMA surface and allowed to react for 30 seconds at room temperature, after which the wafer was spun at 3000 rpm for 60 seconds, removing the excess silane. The wafer was heated at 100° C. for 5 minutes, cooled to room temperature, washed with propylene glycol monomethyl ether acetate (PGMEA) to remove any residual silane, and dried. Next, a photopolymer solution (50 weight percent of photopolymer resin in PGMEA) was filtered onto the wafer. The photopolymer resin used for the contact-molding process consisted of the following components: ethoxylated bisphenol A dimethacrylate (61%), N-vinylpyrrolidone (18.5%), 2-ethyl-2-(hydroxymethyl)-1,3-propanediol trimethacrylate (18.5%), and 2,2-dimethoxy-2-phenylacetophenone (2%) and was prepared according to von Werne et al., *Journal of the American Chemical Society* (2003), volume 125, pages 3831-3838. A transparent mold, consisting of a relief pattern on glass, was brought into contact with the wafer, a pressure of 200 pounds per square inch (1.38 megapascals) was applied, and the assembly was exposed using 365 nanometer light (14 milliwatts per square-centimeter) for 15 minutes. The mold was separated, leaving a patterned photopolymer top layer on the surface of the wafer. The patterned photopolymer wafer was exposed to an oxygen plasma and etched under anisotropic condition, through the PHEMA layer, exposing the bare silicon surface in areas not protected by photopolymer resist. At this point, the wafer consisted primarily of patterned areas of PHEMA coated with photopolymer resist. The wafer was placed in a thermal evaporator and 30 nanometers of gold was deposited over the entire wafer. The gold-coated wafer was placed in an ultrasonic bath with methanol for 1 hour. As a result of this treatment, the residual PHEMA layer was first swollen with methanol then lifted off and was removed along with any gold that had been deposited over the PHEMA layer, leaving a patterned gold layer on the silicon wafer.

Figure 2:
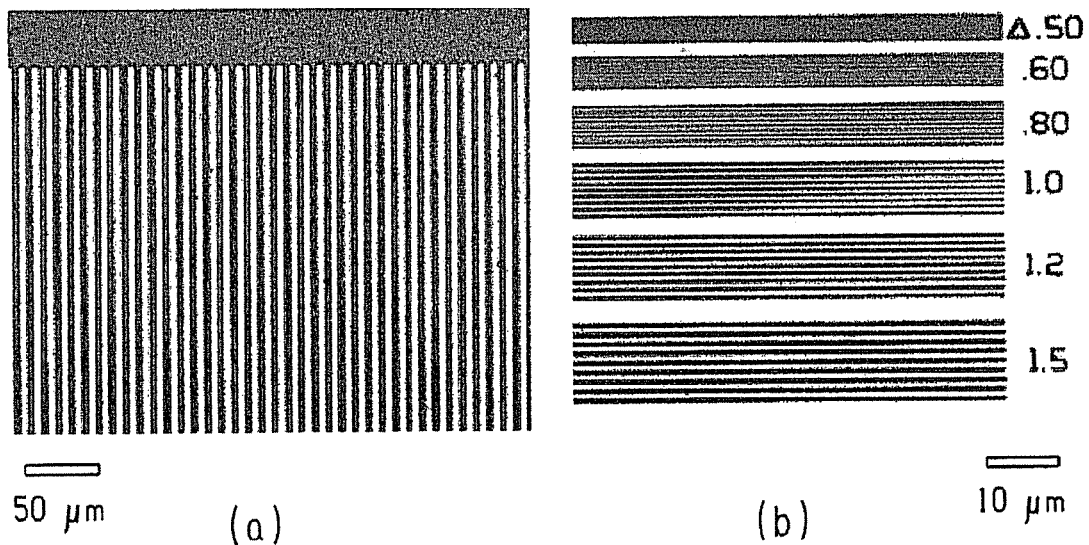
FIG. 2 consists of optical microscope images of gold deposited on an article comprising a patterned polymer layer after 10 minutes of sonication in methanol. Negligible PHEMA lift-off has occurred. The numbers in FIG. 2(b) represent the size of the lines and spaces in microns. The light regions are gold on silicon. The dark regions are gold on patterned polymer.
Figure 3:
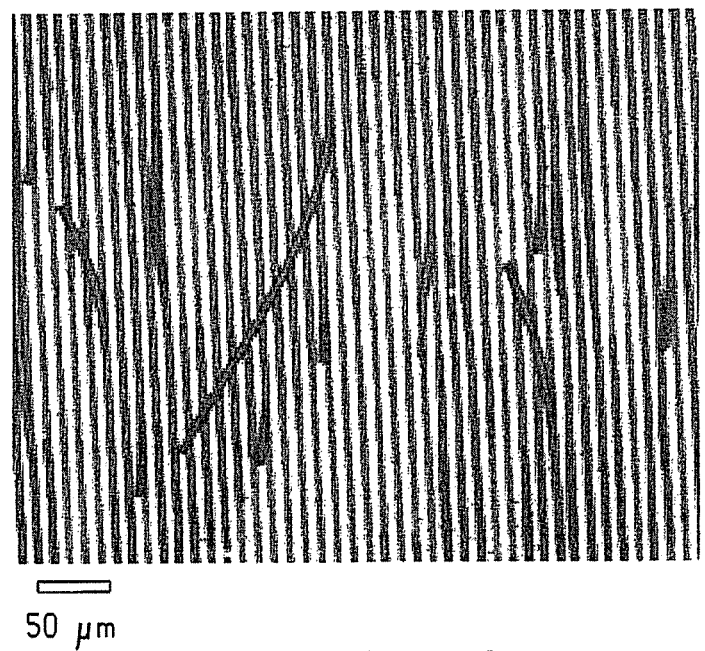
FIG. 3 is an optical microscope image of gold deposited on a patterned polymer layer after 20 minutes of sonication in methanol. Partial lift-off of the gold-coated patterned polymer has occurred.
Figure 4:
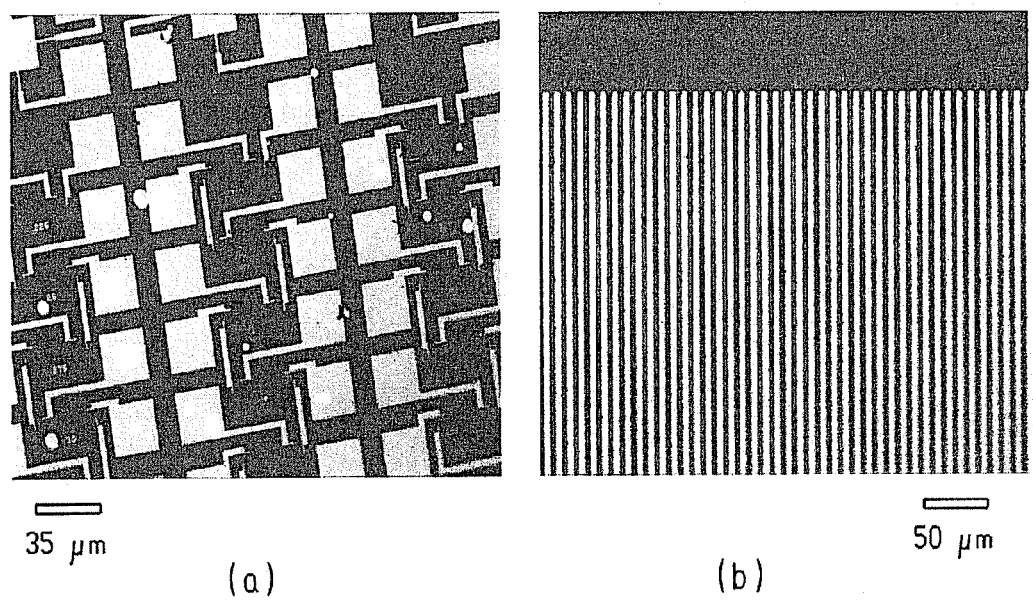
FIG. 4 consists of optical microscope images of patterned gold on silicon surfaces after 60 minutes of sonication in methanol. Complete lift-off of the patterned polymer has occurred.

Images of the article at various stages of the process were obtained with an Olympus microscope fitted with a digital camera. FIG. 2 consists of optical microscope images of gold deposited on an article comprising a patterned polymer layer after 10 minutes of sonication in methanol. Negligible PHEMA lift-off has occurred. The numbers in FIG. 2(*b*) represent the size of the lines and spaces in microns. The light regions are gold on silicon. The dark regions are gold on patterned polymer. FIG. 3 is an optical microscope image of gold deposited on a patterned polymer layer after 20 minutes of sonication in methanol. Partial lift-off of the gold-coated patterned polymer has occurred. FIG. 4 consists of optical microscope images of patterned gold on silicon surfaces after 60 minutes of sonication in methanol. Complete lift-off of the patterned polymer has occurred.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A method of forming an article comprising a patterned functional layer, the method comprising:
    coating a surface of a substrate with a layer comprising a poly(hydroxyethyl methacrylate);
    coating a layer comprising functionalizing agent on a surface of the poly(hydroxyethyl methacrylate) layer; wherein the functionalizing agent comprises a polymerizable group and a hydrolyzable group;
    coating a layer comprising a polymerizable composition on the layer comprising functionalizing agent;
    contacting a patterned stamp with the layer comprising the polymerizable composition to form a patterned layer comprising the polymerizable composition;
    polymerizing the patterned layer comprising the polymerizable composition while the patterned stamp is in contact with it to form a patterned layer comprising a polymerized composition;
    separating the patterned stamp from the patterned layer comprising the polymerized composition to form an article comprising a substrate, a poly(hydroxyethyl methacrylate) layer, a layer comprising functionalizing agent, and a patterned layer comprising a polymerized composition;
    etching the article from a surface comprising the patterned layer comprising the polymerized composition to form an etched article comprising trenches bounded by a floor comprising exposed substrate, and walls comprising poly(hydroxyethyl methacrylate);
    coating a functional layer on a surface of the etched article comprising exposed substrate to form an article comprising a functional layer; and
    treating the article comprising a functional layer with a solvent to lift off the poly(hydroxyethyl methacrylate) layer, thereby forming an article comprising a patterned functional layer in contact with the substrate.

2. The method of claim 1, wherein the substrate comprises a material selected from the group consisting of silicon, glass, metals, metal oxides, metal nitrides, metal alloys, elastomeric polymers, thermoplastic polymers, thermoset polymers, semiconductors, mica, sapphire, organic crystals, and organic thin films.

3. The method of claim 1, wherein the substrate is silicon.

4. The method of claim 1, wherein the poly(hydroxyethyl methacrylate) comprises at least 20 weight percent of repeating units derived from hydroxyethyl methacrylate.

5. The method of claim 1, wherein the poly(hydroxyethyl methacrylate) comprises at least 95 weight percent of repeating units derived from hydroxyethyl methacrylate.

6. The method of claim 1, wherein the poly(hydroxyethyl methacrylate) has a Hildebrand solubility parameter of about 20 to about 26 megapascal$^{1/2}$.

7. The method of claim 1, wherein the poly(hydroxyethyl methacrylate) layer comprises at least 20 weight percent poly(hydroxyethyl methacrylate).

8. The method of claim 1, wherein the poly(hydroxyethyl methacrylate) layer has a thickness of about 5 nanometers to about 50 micrometers.

9. The method of claim 1, wherein the functionalizing agent polymerizable group is selected from the group consisting of vinyl, allyl, ethynyl, propargyl, acryloyl, and methacryloyl; and wherein the functionalizing agent hydrolyzable group is selected from the group consisting of alkoxysilyl groups, chlorosilyl groups, silyl hydride groups, silazane groups, urethane groups, isocyanate groups, and acid chloride groups.

10. The method of claim 1, wherein the functionalizing agent is selected from the group consisting of 3-acryloxypropyldimethoxysilane, 3-acryloxypropyldimethylmethoxysilane, 3-acryloxypropylmethyldimethoxysilane, 3-methacryloxymethyltriethoxysilane, 3-methacryloxymethyltrimethoxysilane, 3-methacryloxypropyldimethylethoxysilane, 3-methacryloxypropyldimethylmethoxysilane, 3-methacryloxypropylmethyldiethoxysilane, 3-methacryloxypropylmethyldimethoxysilane, 3-methacryloxypropyltrimethoxysilane, 3-methacryloxypropyltriethoxysilane, $C_6$-$C_{18}$ alkenoic acid chlorides, and mixtures thereof.

11. The method of claim 1, wherein the functionalizing agent is 3-methacryloxypropyltrimethoxysilane.

12. The method of claim 1, wherein the polymerizable composition comprises an acrylate monomer.

13. The method of claim 1, wherein the polymerizable composition is a photopolymerizable composition comprising a multifunctional acrylate monomer and a photoinitiator.

14. The method of claim 1, wherein the layer comprising the polymerizable composition has a thickness of about 5 nanometers to about 5 micrometers measured prior to contact with the patterned stamp.

15. The method of claim 1, wherein the etching the article comprises etching with a technique selected from the group consisting of dry chemical etching, plasma etching, wet chemical etching, micromachining, electron beam writing, reactive ion etching, laser micromachining, ablation, mechanical machining, mechanical abrasion or scratching, drilling, ion beam milling, UV degradation, and evaporation.

16. The method of claim 1, wherein the etching the article comprises anisotropically etching with an oxygen plasma.

17. The method of claim 1, wherein the functional layer comprises a material selected from the group consisting of electrically conducting materials, semiconducting materials, electrically insulating materials, optically active materials, reflective materials, transparent materials, optically absorbing materials, optically emissive materials, thermally conductive materials, thermally insulating materials, and magnetic materials.

18. The method of claim 1, wherein the functional layer comprises at least 90 weight percent gold.

19. The method of claim 1, wherein the functional layer has a thickness of about 0.1 nanometer to about 50 micrometers.

20. The method of claim 1, wherein the solvent has a Hildebrand solubility parameter of about 23 to about 35 megapascal$^{1/2}$.

21. The method of claim 1, wherein the solvent is selected from the group consisting of methanol, ethanol, n-propanol, isopropanol, ethylene glycol, propylene glycol, 1-methoxy-2-propanol, 1-phenoxy-2-propanol, dimethylformamide, dimethylacetamide, N-methyl-2-pyrrolidone, N-cyclohexyl-2-pyrrolidinone, hexamethylphosphoramide, 1,3-dimethyl-3,4,5,6-tetrahydro-2(1H)-pyrimidinone, dimethyl sulfoxide, m-cresol, formic acid, and mixtures thereof.

22. The method of claim 1, wherein the solvent is methanol.

23. The method of claim 1, wherein said treating the metal-coated article with solvent substantially removes the poly(hydroxyethyl methacrylate) layer from the article.

24. A method of forming an article comprising a patterned functional layer, the method comprising:
    coating a surface of a substrate with a layer comprising a poly(hydroxyethyl methacrylate) to form a first structure;
    coating a layer comprising a functionalizing agent on a surface of the poly(hydroxyethyl methacrylate) layer to form a second structure; wherein the functionalizing agent comprises a polymerizable group and a hydrolyzable group;
    coating a layer comprising a polymerizable composition on the layer comprising a functionalizing agent to form a third structure comprising a substrate, a poly(hydroxyethyl methacrylate) layer, a functionalizing agent layer, and a polymerizable composition layer;
    contacting a patterned stamp with the polymerizable composition layer to form a fourth structure comprising a substrate, a poly(hydroxyethyl methacrylate) layer, a functionalizing agent layer, a patterned polymerizable composition layer, and a patterned stamp;
    polymerizing the patterned polymerizable composition while the patterned stamp is in contact with it to form a fifth structure comprising a substrate, a poly(hydroxyethyl methacrylate) layer, a functionalizing agent layer, a patterned layer comprising a polymerized composition, and a patterned stamp;
    separating the patterned stamp from the patterned layer comprising the polymerized composition to form a sixth structure comprising a substrate, a poly(hydroxyethyl methacrylate) layer, a functionalizing agent layer, and a patterned layer comprising a polymerized composition;
    etching the sixth structure from a surface comprising the patterned layer to form a seventh structure comprising a substrate and a patterned poly(hydroxyethyl methacrylate) layer; wherein the seventh structure comprises trenches bounded by a floor comprising exposed substrate, and walls comprising poly(hydroxyethyl methacrylate);
    coating a functional layer on a surface of the seventh structure to form an eighth structure comprising a substrate, a patterned poly(hydroxyethyl methacrylate) layer, and a functional layer; wherein the eighth structure comprises trenches bounded by a floor comprising a functional layer in contact with the underlying substrate, and walls comprising a functional layer and a poly(hydroxyethyl methacrylate) layer; and
    treating the eighth structure with a solvent to lift off the poly(hydroxyethyl methacrylate) layer to form a ninth structure comprising a patterned functional layer and a substrate;
    wherein for each structure the layers are in the recited order, with each layer contacting the previously recited layer.

25. A method for forming an article comprising a patterned metallic layer, the method comprising:
    coating a poly(hydroxyethyl methacrylate) layer on a surface of a silicon substrate;
    coating a 3-methacryloxypropyltrimethoxysilane layer on a surface of the poly(hydroxyethyl methacrylate) layer;
    coating a photopolymerizable acrylate layer on a surface of the 3-methacryloxypropyltrimethoxysilane layer;

contacting a surface of the photopolymerizable acrylate layer with a UV-translucent patterned stamp; wherein the UV-translucent patterned stamp is applied to the surface of the photopolymerizable acrylate layer with a pressure of about 0.001 to about 15 megapascals;

photopolymerizing the photopolymerizable acrylate layer by exposing it to ultraviolet light via the UV-translucent patterned stamp;

separating the UV-translucent patterned stamp from the photopolymerized acrylate layer;

oxygen plasma etching the photopolymerized acrylate layer, the 3-methacryloxypropyltrimethoxysilane layer, and the poly(hydroxyethyl methacrylate) layer to form a seventh structure comprising a silicon substrate and a patterned poly(hydroxyethyl methacrylate) layer; wherein the seventh structure comprises trenches bounded by a floor comprising exposed silicon substrate, and walls comprising poly(hydroxyethyl methacrylate);

coating gold on a surface of the seventh structure to form an eighth structure comprising a gold layer, a patterned poly(hydroxyethyl methacrylate) layer, and a silicon substrate; and agitating the eighth structure in the presence of methanol to lift off the patterned poly(hydroxyethyl methacrylate) layer and yield a ninth structure comprising a patterned gold layer in contact with the silicon substrate.

* * * * *